United States Patent
Ly et al.

(10) Patent No.: US 12,305,277 B2
(45) Date of Patent: May 20, 2025

(54) METHODS OF PRODUCING SINGLE-LAYER TRANSITION METAL SELENIDE

(71) Applicant: CITY UNIVERSITY OF HONG KONG, Kowloon (HK)

(72) Inventors: Thuc Hue Ly, Kowloon (HK); Ping Man, Kowloon (HK); Ka Ho Leung, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 23 days.

(21) Appl. No.: 18/402,355

(22) Filed: Jan. 2, 2024

(65) Prior Publication Data

US 2024/0218507 A1    Jul. 4, 2024

Related U.S. Application Data

(60) Provisional application No. 63/478,308, filed on Jan. 3, 2023.

(51) Int. Cl.
| | | |
|---|---|---|
| *C23C 16/30* | (2006.01) | |
| *C23C 16/44* | (2006.01) | |
| *C23C 16/448* | (2006.01) | |

(52) U.S. Cl.
CPC ........ *C23C 16/4485* (2013.01); *C23C 16/305* (2013.01); *C23C 16/4408* (2013.01)

(58) Field of Classification Search
CPC .............. C23C 16/305; C23C 16/4408; C23C 16/4485
See application file for complete search history.

(56) References Cited

U.S. PATENT DOCUMENTS

| | | | |
|---|---|---|---|
| 2007/0169812 A1* | 7/2007 | Robinson | H10F 77/14 257/E31.007 |
| 2009/0320916 A1* | 12/2009 | Yuan | H10F 71/1276 977/773 |
| 2011/0056564 A1* | 3/2011 | Korgel | C09C 1/00 423/511 |
| 2012/0080091 A1* | 4/2012 | Min | C23C 18/1295 136/262 |
| 2015/0137039 A1* | 5/2015 | Agrawal | C01B 19/007 252/364 |
| 2016/0237561 A1* | 8/2016 | Mahajan | C23C 16/455 |
| 2018/0223213 A1* | 8/2018 | García Alonso | C08K 9/08 |
| 2019/0123232 A1* | 4/2019 | Mahajan | C23C 16/52 |

(Continued)

OTHER PUBLICATIONS

Dong, Hailong, et al., "Colloidally stable selenium@copper selenide core@shell nanoparticles as selenium source for manufacturing of copper-indium-selenide solar cells". Journal of Colloid and Interface Science 415 (2014) 103-110.*

(Continued)

*Primary Examiner* — Bret P Chen
(74) *Attorney, Agent, or Firm* — Conley Rose, P.C.; Michael W. Piper; Gayatry Nair

(57) ABSTRACT

Disclosed herein is a method of producing a substrate having a single-layer transition metal selenide (TMS) nanoflakes deposited thereon. The method is characterized in not using hydrogen as a reducing agent during the deposition of monolayer TMS nanoflakes on the substrate. Such substrates may serve as an optic, an electronic device, a mechanic, a sensor etc.

15 Claims, 14 Drawing Sheets

(56) References Cited

U.S. PATENT DOCUMENTS

2019/0193048 A1* 6/2019 Abbas .................... C02F 1/288
2020/0010761 A1* 1/2020 Truskier ............... C09K 11/883

OTHER PUBLICATIONS

Cho, Hyunjin, et al., "High-performance photoelectrochemical cells with MoS2 nanoflakes/TiO2 photoanode on 3D porous carbon spun fabric". Advanced Sensor and Energy Materials 3 (2024) 100088, pp. 1-10.*

Nguyen, Quyen T., et al., "Novel Amorphous Molybdenum Selenide as an Efficient Catalyst for Hydrogen Evolution Reaction". ACS Appl. Mater. Interfaces 2018, 10, 8659-8665.*

Neilson, Joseph, et al., "Tiled Monolayer Films of 2D Molybdenum Disulfide Nanoflakes Assembled at Liquid/Liquid Interfaces". ACS Appl. Mater. Interfaces 2020, 12, 25125-25134.*

* cited by examiner

METHODS OF PRODUCING SINGLE-LAYER TRANSITION METAL SELENIDE

CROSS-REFERENCE TO RELATED APPLICATIONS

This application claims priority and the benefit of U.S. Provisional Patent Application No. 63/478,308, filed Jan. 3, 2023, the entirety of which is incorporated herein by reference

BACKGROUND OF THE INVENTION

1. Field of the Invention

The present invention relates to methods of forming a single-layer of transition metal selenide (TMS); and more particularly, to methods of forming a single-layer TMS on a substrate without using hydrogen gas as the reducing agent during the deposition of TMS nanoflakes.

2. Description of Related Art

In recent years, two-dimensional (2D) transition metal selenides (TMSs), as an emerging 2D material, has high carrier mobility, mechanical flexibility, chemical stability and photosensitivity, and is an ideal candidate material for future flexible electronic, optoelectronic and photovoltaic devices. As a member of the TMSs family, 2D $WSe_2$ differs from other TMSs in that $WSe_2$ is a p-type charge carrier, while most TMS materials are n-type semiconductors. Note that p-type charge carrier is the most frequently used 2D materials in application, such as photoelectrochemical cell, photovoltaic device and LED.

The "pick-up" and "drop-down" processes are the basic strategies used to construct 2D materials. Chemical vapor deposition (CVD) is the most promising technique for wafer-scale targets of high-quality 2D materials in industrial applications, relying on the gases or controlled evaporation of liquid precursors to control precursor flow in the vapor phase with deposition reproducibility. For TMSs, selenides and transitional metal oxides are the widely adopted deposition sources. However, the synthesis process is relatively difficult than that of transition metal sulfides, since selenium precursors are less reactive than sulfur precursors. On the other hand, the M-Se bonding energy is usually higher than the one of M-S. Therefore, in the synthesis of most TMSs, such as $MoSe_2$, $WSe_2$, $ReSe_2$, $In_2Se_3$, and the like, $H_2$ or $H_2Se$ is essential pretreating catalyst to decompose the molecular ring of $Se_8$ or $Se_{8-x}$. Until now, the role of $H_2$ in this system remains unclear, although its use has become a common sense. At the same time, hydrogen safety is an ongoing concern, which has created limitations and challenges for research and production efforts.

In view of the above, there exists a need of finding other cheap, non-polluting and operable alternatives of hydrogen for synthesizing single-layer TMS, particularly a process for synthesizing TMS without the potential risk of hydrogen explosion.

SUMMARY

Embodiments of the present disclosure relate to methods of forming substrates independently having a wrinkle pattern of a single-layer TMS nanoflakes (e.g., $WSe_2$ nanoflakes), and such substrates may serve as an optic, an electronic device, a mechanic, a sensor etc. The objective of the present disclosure therefore is to provide a method of producing a substrate having a single-layer TMS nanoflakes deposited thereon in a reaction chamber, in which the reaction chamber has a tubular body, and first and second containers disposed in the tubular body, and the method includes steps of:

(a) spin-coating the substrate with a transition metal source solution;

(b) respectively placing a selenium source and a reducing agent in the first and second containers, in which the reducing agent is a metal and not hydrogen gas;

(c) placing the substrate of step (a) above the second container with the spin-coated side of the substrate facing the reducing agent housed in the second container;

(d) purging the reaction chamber with an inert gas, in which the inert gas flows from the first container towards the second container;

(e) subjecting the reaction chamber in a heating program, in which the temperature in the first container is raised from room temperature to 400° C. in 20 minutes and kept for 15 minutes, while the temperature in the second container is raised from room temperature to 750-900° C. in 25 minutes and kept for 10 minutes;

(f) allowing the temperature of the second container to cool down to 500° C.; and (g) cooling the reaction chamber to room temperature thereby depositing the single-layer TMS nanoflakes on the substrate.

According to embodiments of the present disclosure, the transition metal source solution in step (a) is produced by dissolving a slat of a transition metal in water. Examples of the transition metal salt suitable for use in the present disclosure include, but are not limited to, indium (In), molybdenum (Mo), rhenium (Re), and tungsten (W) based salt. In one preferred embodiment, the transition metal source solution in step (a) is produced by dissolving sodium tungsten dihydrate in water. Optionally or in addition, the transition metal solution may further comprise iodixanol or glycerol. In one preferred embodiment, the transition metal source solution is produced by dissolving sodium tungsten dihydrate and iodixanol in water, in which sodium tungsten dihydrate and iodixanol are present in a ratio of 6.5:1 by weight in the water.

According to embodiments of the present disclosure, the selenide source in the first container and the reducing agent in the second container are present in a ratio of 15:1 to 1:1 by weight. In one preferred embodiment, the selenide source in the first container and the reducing agent are present in the ratio of 10:1 by weight.

According to embodiments of the present disclosure, the reducing agent is a metal selected from the group consisting of alumina, copper, iron, nickel, lead, tin, and zinc. In one preferred embodiment, the reducing agent is zinc. In another preferred embodiment, the reducing agent is alumina.

Examples of the substrate suitable for use in the present method include, but are not limited to, $SiO_2$ substrate, mica substrate, sapphire substrate, and the like.

According to embodiments of the present disclosure, in step (a), the substrate is spin-coated with the transition metal source solution at 800 rpm for 5 seconds, followed by 3,000 rpm for 60 seconds.

Examples of the inert gas suitable for use in the present method include, but are not limited to, nitrogen, argon, and the like. In certain embodiments, in step (d), the reaction chamber is purged with argon at a flow rate of 100-300 mL/minute, preferably, the reaction chamber is purged with argon at the flow rate of 300 mL/minute.

According to optional embodiments of the present disclosure, the method further comprises cleansing the substrate with an acidic solution prior to step (a). Preferably, the substrate is cleaned with a diluted sulfuric acid ($H_2SO_4$) solution prior to step (a).

According to embodiments of the present disclosure, the TMS produced by the method of the present disclosure may be any one of $In_2Se_3$, $MoSe_2$, $ReSe_2$, or $WSe_2$.

Other and further embodiments of the present disclosure are described in more detail below.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Detailed descriptions and technical contents of the present disclosure are illustrated below in conjunction with the accompanying drawings. However, it is to be understood that the descriptions and the accompanying drawings disclosed herein are merely illustrative and exemplary and not intended to limit the scope of the present disclosure.

Embodiments of the present disclosure include an improved method of producing a substrate having a single-layer $WSe_2$ formed thereon, in which metal powders are used to replace conventional hydrogen gas as a reducing agent during the deposition of $WSe_2$ nanoflakes. Such substrate may be used, for example, in the field of electronic devices, photovoltaic devices, optoelectronic devices etc. Methods in accordance with embodiments of the present disclosure are advantageously simple, easy-to-use, and pollution-free, thus are suitable for producing substrates having desired single-layer $WSe_2$ in large scale.

The present method is characterized in forming a single-layer of TMS (e.g., $WSe_2$) on a substrate without using hydrogen gas as a reducing agent, thereby eliminating the explosion risk associated with the use of hydrogen gas. To this purpose, an atomic crystal layer of TMS (e.g., single-layer of $WSe_2$) is formed on a substrate via chemical vapor deposition (CVD) in a reaction chamber (e.g., a tube furnace), in which metal powders are used as a reducing agent and as a replacement of hydrogen gas during the formation of the single-layer TMS.

Figure 1A:
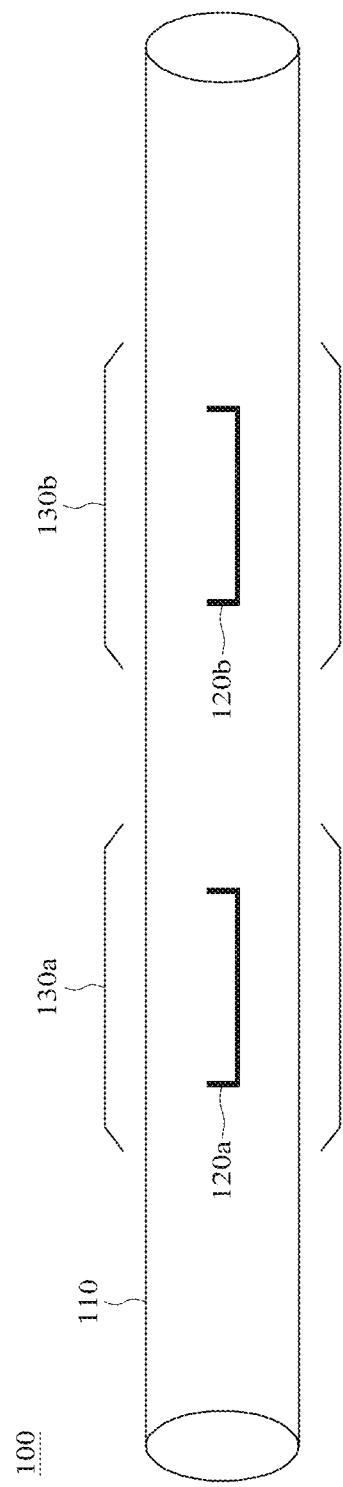
FIG. 1A is a schematic diagram of a tube furnace 100 in accordance with preferred embodiments of the present disclosure.

Reference is made to FIG. 1A, which is a schematic diagram of a tube furnace 100 suitable for implementing the present method. The tube furnace 100 includes in its structure, at least, a tubular body 110; and first and second containers 120a, 120b independently for housing reactants necessary for the formation of single-layer of TMS nanoflakes, including but is not limited to, the selenide source, the reducing agent, etc. Further, the first and second containers 120a, 120b are disposed within the tubular body 110, with the first container 120a being upstream to the second container 120b. The tubular body 110 has first and second temperature zones 130a, 130b, in which each temperature zone may be set at same or different temperatures. Note that in the present disclosure, each temperature zone refers to a certain section of the tubular body 110 coupled to at least, a heater and a temperature sensor (not visible from FIG. 1A), to bring the temperature of that certain section of the tubular body 110 to any pre-designated temperature during deposition of TMS.

Figure 1B:
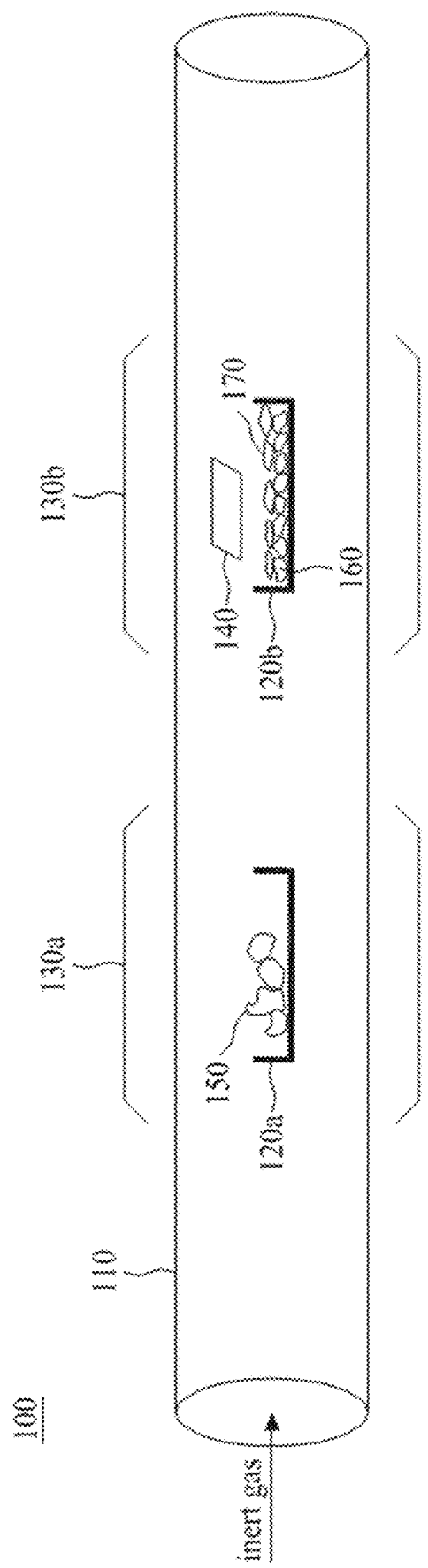
FIG. 1B is a schematic diagram depicting the tube furnace 100 of FIG. 1A in operation in accordance with preferred embodiments of the present disclosure.

Reference is now made to FIG. 1B, which depicts the tube furnace 100 of FIG. 1A in operation. The present method commences from placing a sufficient amount of a selenide source 150 (e.g., selenide beads) in the first container 120a, while at the same time, placing a sufficient amount of a reducing agent 160 (e.g., aluminum powders) evenly at the bottom of the second container 120b, then mounting a substrate 140 that has been spin-coated with a transition metal source solution above the second container 120b with the spin-coated side facing the reducing agent 160 without direct contacting the reducing agent 160. The transition metal source solution is prepared by dissolving suitable amount of a salt of a transition metal (e.g., sodium tungsten dihydrate) in water. Optionally or in addition, the transition metal source solution may further comprise iodixanol or glycerol, which helps induce defect during the growth of TMS monolayer. According to preferred embodiments of the present disclosure, the transition metal source solution is produced by dissolving sodium tungsten dihydrate and iodixanol in water, in which sodium tungsten dihydrate and iodixanol are present in a ratio of about 10:1 to 1:1 by weight in the water, such as 10:1, 9.5:1, 9:1, 8.5:1, 8:1, 7.5:1, 7:1, 6.5:1, 6:1, 5.5:1, 5:1, 4.5:1, 4:1, 3.5:1, 3:1. 2.5:1, 2:1, 1.5:1 and 1:1 by weight; more preferably, sodium tungsten dihydrate and iodixanol are present in a ratio of about 8:1 to 5:1 by weight in the water, such as 8:1, 7.5:1, 7:1, 6.5:1, 6:1, 5.5:1, and 5:1 by weight; most preferably, sodium tungsten dihydrate and iodixanol are present in a ratio of about 6.5:1 by weight in the water. Examples of the substrate suitable for use in the present method include, but are not limited to, $SiO_2$ substrate, mica substrate, sapphire substrate and etc. In one preferred embodiment of the present disclosure, the substrate is $SiO_2$ substrate.

According to embodiments of the present disclosure, the selenide source 150 in the first container 120a and the reducing agent 160 in the second container 120b are present in a ratio of 15:1 to 1:1 by weight, such as 15:1, 14:1, 13:1, 12:1, 10:1, 9:1, 8:1, 7:1, 6:1, 5:1, 4:1, 3:1, 2:1, and 1:1; more preferably, the selenide source 150 and the reducing agent 160 are present in the ratio of 10:1 by weight. According to embodiments of the present disclosure, the reducing agent suitable for use in the present method is a metal selected from the group consisting of alumina, copper, iron, nickel, lead, tin, and zinc. In one preferred embodiment, the reducing agent is zinc. In another preferred embodiment, the reducing agent is alumina.

The first and second container 120a, 120b are respectively disposed at the first and second temperature zones 130a, 130b in the tubular body 110, so that they may be subsequently subjected to heating programs for the deposition of TMS. Prior to commencing the heating programs, the tubular body 110 is purged with an inert gas to completely replace air therein with the inert gas. Examples of the inert gas suitable for use in the present method include, but are not limited to, helium, nitrogen, argon, etc. Preferably, the tubular body 110 is purged with argon, in which the argon flows from upstream to downstream of the tubular body 110, that is, from the first temperature zone 130a towards the second temperature zone 130b. According to embodiments of the present disclosure, the tubular body 110 is purged with argon at a flow rate of 100-300 mL/minute (sccm), such as 100, 110, 120, 130, 140, 150, 160, 170, 180, 200, 210, 220, 230, 240, 250, 260, 270, 280, 290, 300 mL/minute; more preferably, the tube furnace 100 is purged with argon at the flow rate of 150-300 mL/minute, such as 150, 160, 170, 180, 190, 200, 210, 220, 230, 240, 250, 260, 270, 280, 290, 300 mL/minute; more preferably, the tube furnace 100 is purged with argon at the flow rate of 200-300 mL/minute, such as 200, 210, 220, 230, 240, 250, 260, 270, 280, 290, 300 mL/minute; most preferably, the tube furnace 100 is purged with argon at the flow rate of 300 mL/minute.

The first and second container 120a, 120b, which are respectively disposed at the first and second temperature zones 130a, 130b of the tube furnace 100, are then subjected to heating programs. Upon commencing the heating programs, the temperature in the first temperature zone 130a is raised from room temperature to about 410° C. in 20 minutes and kept at 400° ° C. for another 10-20 minutes; while the temperature in the second temperature zone 130b is raised from room temperature to 750-900° C. in 25 minutes and kept at 800° C. for another 5-15 minutes. Specifically, the temperature in the second temperature zone 130b is raised from room temperature to 750, 760, 770, 780, 790, 800, 810, 820, 830, 840, 850, 860, 870, 880, 890, or 900° C. in 25 minutes, and kept at 800° ° C. for 5, 6, 7, 8, 9, 10, 11, 12, 13, 14 or 15 minutes.

The heating programs described herein will cause vaporization of the materials respectively housed in the first and second containers 120a, 120b (e.g., selenide beads and the reducing agent), the vaporized materials are subsequently deposited on the surface of the substrate 140 mounted above the second container 120b when the second temperature zone 130b is cooled, thereby forming the desired single-layer TMS. After the heating program, the temperature in the second temperature zone 130b returns slowly and naturally to 500° C., while the temperature of the tube furnace 100 returns quickly (e.g., within about 5 minutes) to room temperature, thereby resulting the deposition of TMS on the substrate 140.

According to embodiments of the present disclosure, the thus deposited TMS nanoflakes may be any one of $In_2Se_3$, $MoSe_2$, $ReSe_2$, or $WSe_2$ nanoflakes. In one preferred embodiment, the thus deposited $WSe_2$ nanoflakes are highly crystalline and have a thickness about 0.61 nm, which indicates that the $WSe_2$ nanoflakes deposited by the present method are in single-layer structure. According to embodiments of the present disclosure, the substrate prepared in accordance with the method described above may be used, for example, in the field of electronic devices, photovoltaic devices, optoelectronic devices etc.

EXAMPLES

Example 1: Producing a Substrate Having a Single-Layer $WSe_2$ Deposited Thereon 1.1 Depositing Single-Layer $WSe_2$ in the Presence of Aluminum In this example, a $SiO_2$ substrate having a single-layer $WSe_2$ deposited thereon was prepared in a quartz tube furnace like the one depicted in FIG. 1A, which comprised two heating areas respectively termed as temperature zones I and II.

To this purpose, a $SiO_2$ substrate about 1 $cm^2$ was spin-coated with a tungsten solution at a rate of 800 rpm for 5 seconds, followed by a rate of 3,000 rpm for 60 seconds. The tungsten solution was produced by mixing sodium tungsten dihydrate (6.5 mg) and iodixanol (1 mg) in deionized water (0.5 mL).

Then, selenium beads (30 mg) and aluminum powders (10 mg) were respectively placed in quartz boats A and B. The spin-coated $SiO_2$ substrate was mounted onto quartz boat B, with the spin-coated side facing towards aluminum powders. Quartz boat B was then placed in the middle of heating zone II while quartz boat A was placed in the middle of heating zone I (FIG. 1B). Noted the heating zone I was upstream to heating zone II, as shown in FIG. 1A. The furnace system was then well-sealed and injected with argon gas at a flow rate of 1,000 sccm for 10 minutes to purge out all air remained in the quartz tube, then the flow rate was adjusted to 200 sccm during synthesis, while the furnace was subjected to a heating program as follows: the temperature in zone II was raised from room temperature to 800° C. in 25 minutes and kept for 10 minutes; the temperature in zone I was raised from room temperature to 400° C. in 20 minutes and kept for 15 mins. After the heating program was finished, allowed zone II to cool down naturally to 500° C., then opened both heating zones to allow rapid cooling to room temperature of both heating zone thereby producing a monolayer WSe$_2$ nanoflakes on the substrate. Results are provided in FIGS. 2 to 6.

Figure 2:
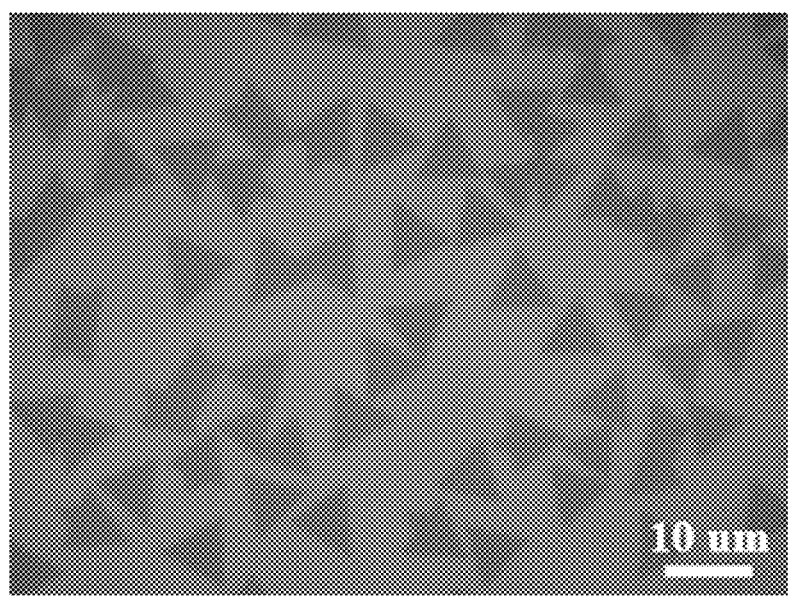
FIG. 2 is a photograph showing numerous $WSe_2$ nanoflakes deposited on a $SiO_2$ substrate in accordance with one embodiment of the present disclosure.
Figure 3:
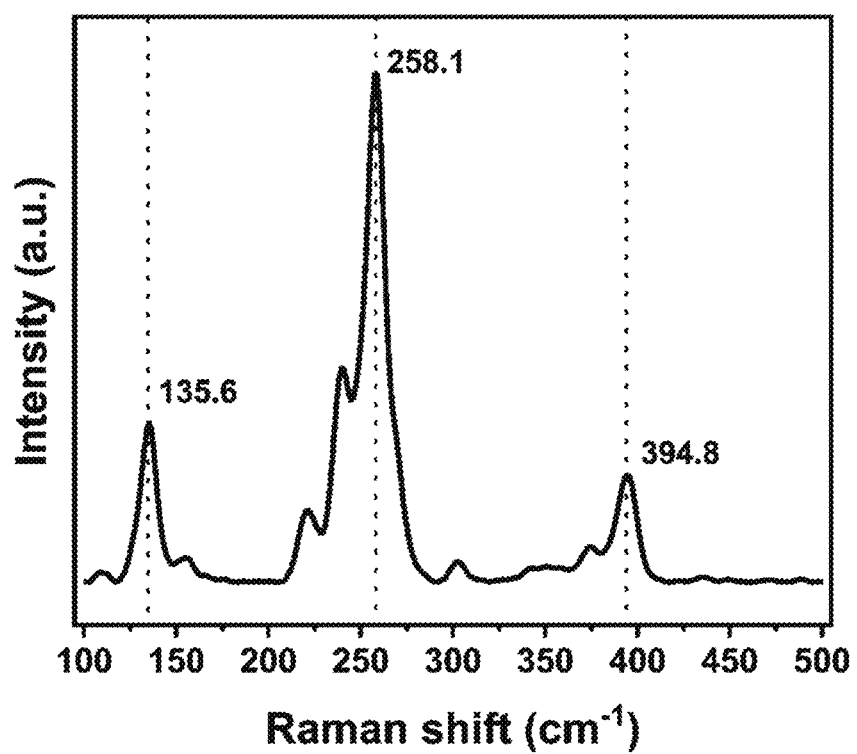
FIG. 3 is the Raman spectrum of the $WSe_2$ nanoflakes formed on the $SiO_2$ substrate in FIG. 2.
Figure 4:
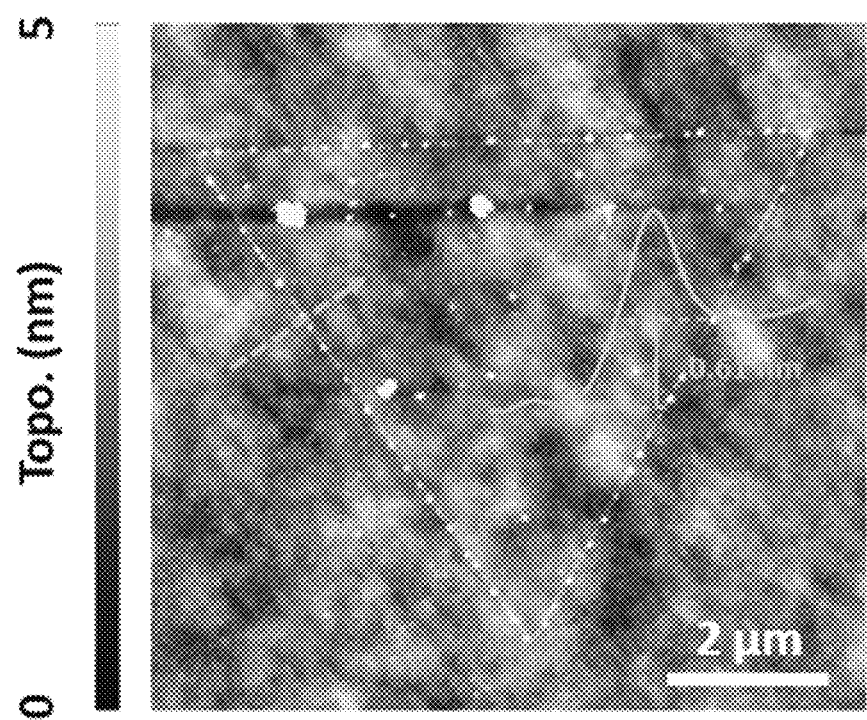
FIG. 4 is an atomic force microscope image of the $WSe_2$ nanoflakes formed on the $SiO_2$ substrate in FIG. 2.
Figure 5:
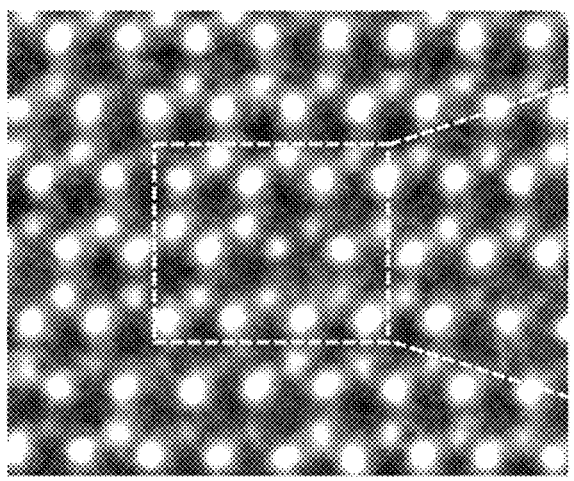
FIG. 5 is a transmission electron microscope (TEM) image of a single-layer $WSe_2$ nanoflakes formed on the $SiO_2$ substrate in FIG. 2.
Figure 5:
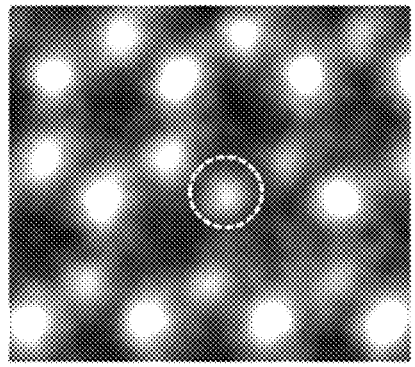
Figure 6:
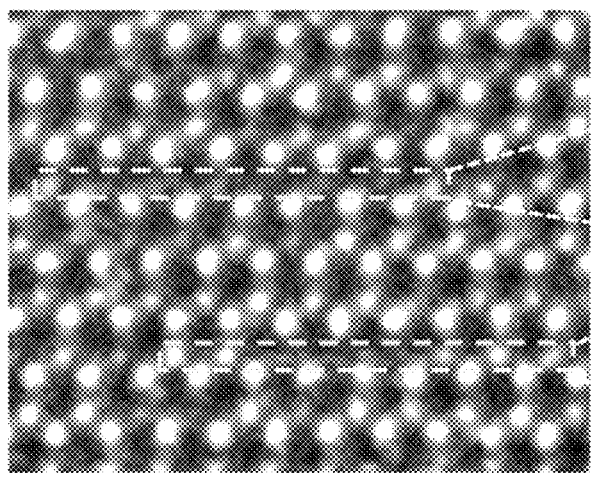
FIG. 6 is the TEM image of a single-layer $WSe_2$ nanoflakes deposited on the $SiO_2$ substrate of FIG. 2, in which numerous selenide defects were observed in the TEM image.
Figure 6:
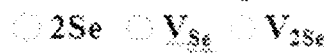
Figure 6:
Figure 6:

FIG. 2 is the photograph showing numerous WSe$_2$ nanoflakes deposited on the SiO$_2$ substrate, while FIG. 3 is the Raman spectrum of the WSe$_2$ nanoflakes in FIG. 2, in which the characteristic peaks of WSe$_2$ could be easily identified therefrom, which was an indication of the formation of highly crystalline WSe$_2$. FIG. 4 is an atomic force microscope image of WSe$_2$ nanoflakes on the SiO$_2$ substrate, in which the WSe$_2$ nanoflakes thus formed was about 0.61 nm in thickness, indicating that the WSe$_2$ nanoflakes were indeed in a single-layer structure. FIG. 5 is a transmission electron microscope image of WSe$_2$ grown on SiO$_2$ and transferred to TEM grid, small amount of aluminum doping could be observed and selenide vacancy was found on FIG. 6, confirming that introducing aluminum powders as a reducing agent and as a replacement of hydrogen gas could create defects on the WSe$_2$ nanoflakes, which might enhance the performance of the thus deposited WSe$_2$ nanoflakes and/or a device comprising the thus deposited WSe$_2$ nanoflakes.

1.2 Effect of Pre-Cleaning the Substrate on the Deposition of Single-Layer WSe$_2$ In this example, a substrate having a single-layer WSe$_2$ deposited thereon was prepared in accordance with similar procedures described in Example 1.1, except the SiO$_2$ substrate was cleansed with 0.5 M H$_2$SO$_4$ for 2 minutes prior to spin-coated with the tungsten source solution, and zinc powders were used to replace the aluminum powders as the reducing agent. A SiO$_2$ substrate having a monolayer WSe$_2$ nanoflakes deposited thereon was produced.

Example 2: Characterization of the Metal-Assisted Deposition of Single-Layer WSe$_2$ In this example, effects of various metal reducing agents on the deposition of single-layer WSe$_2$ were investigated. In general, single-layer WSe$_2$ was deposited on SiO$_2$ substrate in accordance with procedures of Example 1.1, except the powders of aluminum were replaced by powders/film of zinc, iron, tin, lead or copper. Results are depicted in FIGS. 7 to 10.

Figure 7:
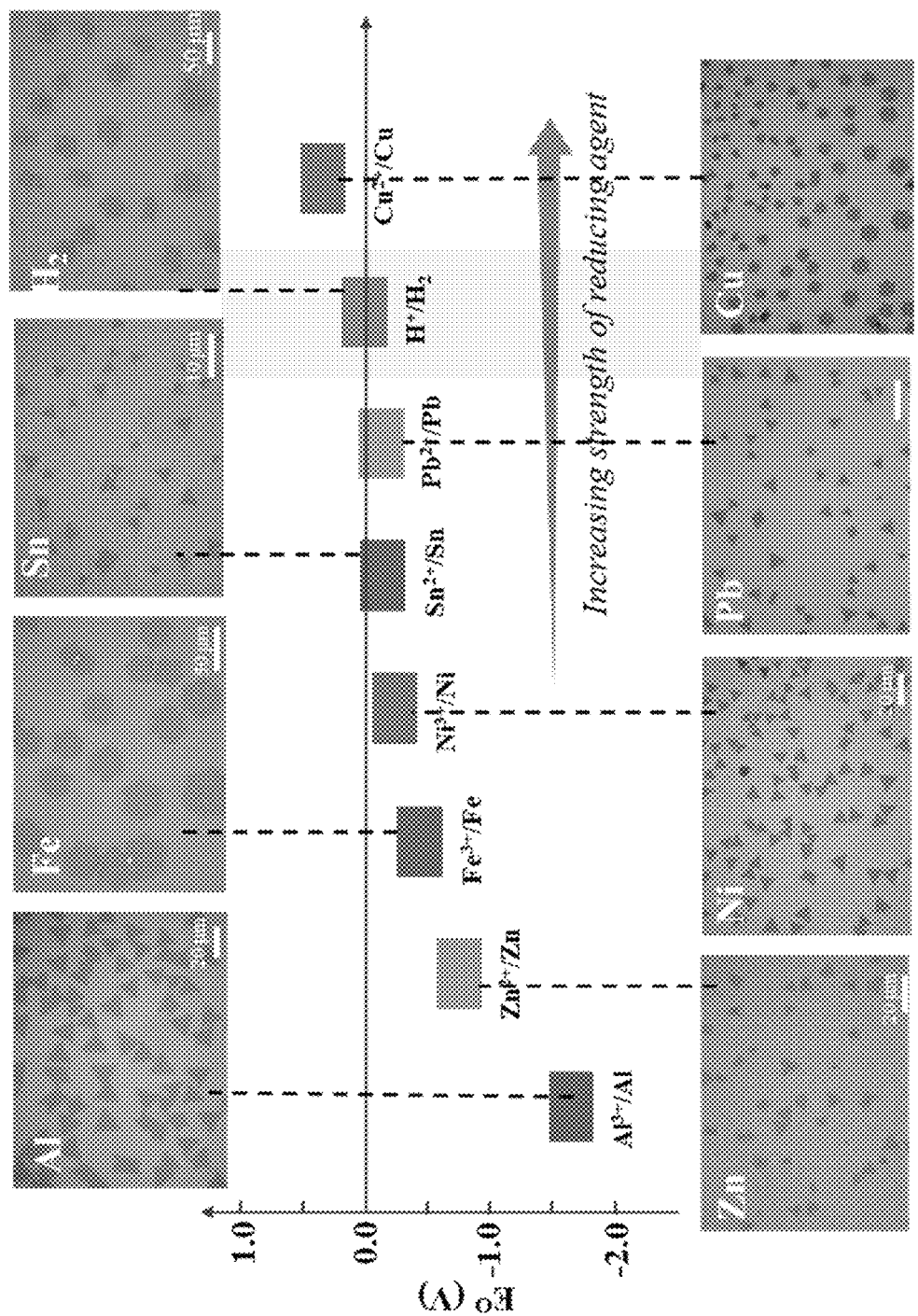
FIG. 7 depicts the activity sequence of different metals, including Al, Zn, Fe, Ni, Sn, Pb, Cu, and optical microscope (OM) images of $WSe_2$ thus synthesized in accordance with one embodiment of the present disclosure.
Figure 8A:
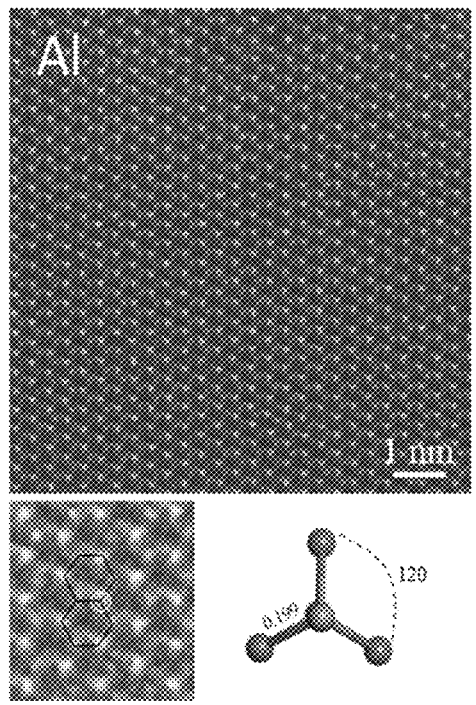
FIG. 8A to 8H are atom-resolved scanning transmission electron microscopy (STEM) images of $WSe_2$ monolayers synthesized in accordance with one embodiment of the present disclosure, with corresponding image showing the existed cation doping and their surrounding bonding length and bonding angle.
Figure 8B:
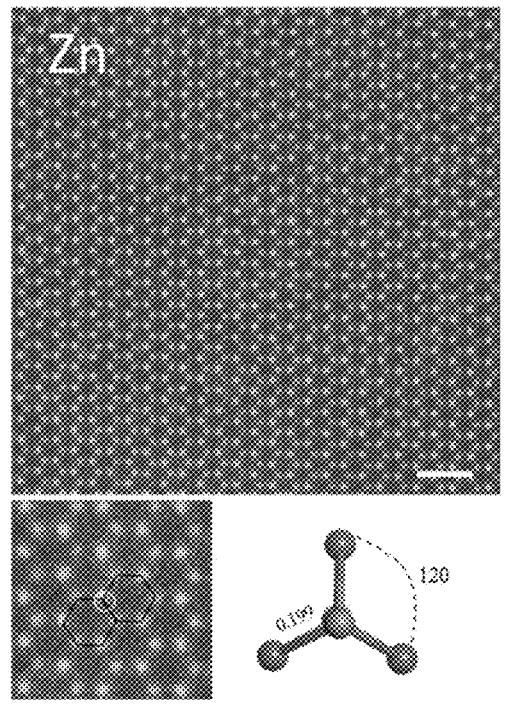
Figure 8C:
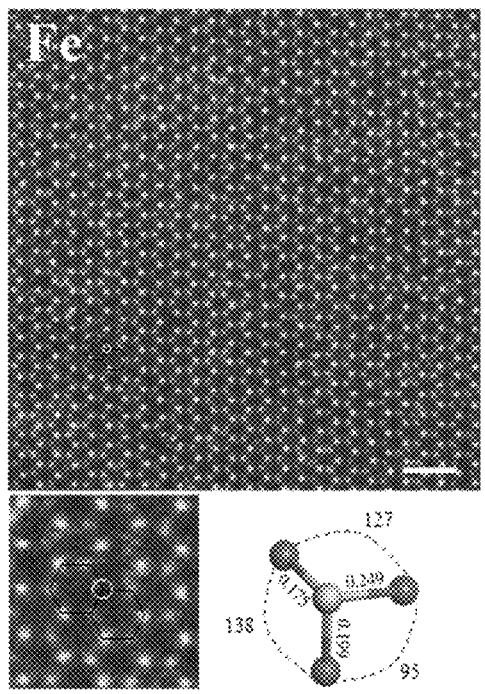
Figure 8D:
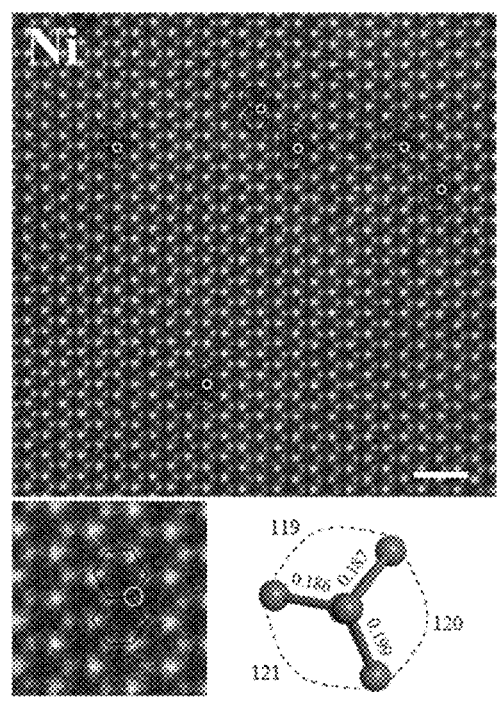
Figure 8E:
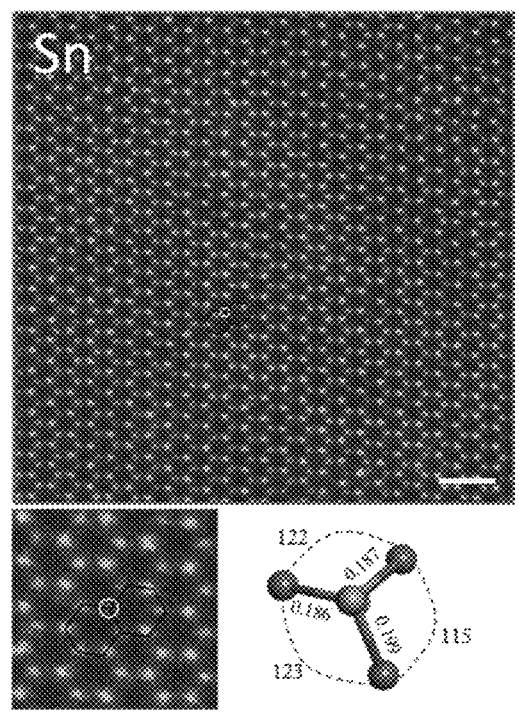
Figure 8F:
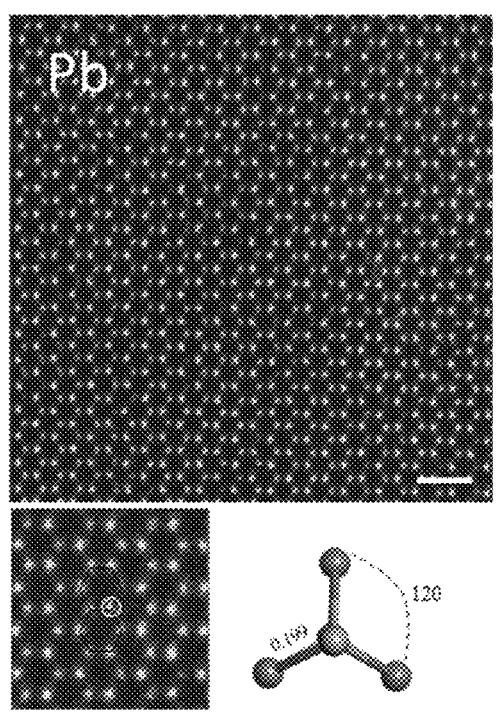
Figure 8G:
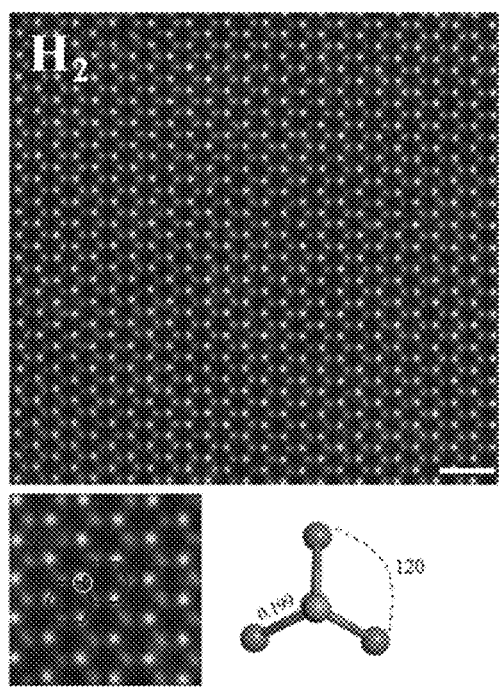
Figure 8H:
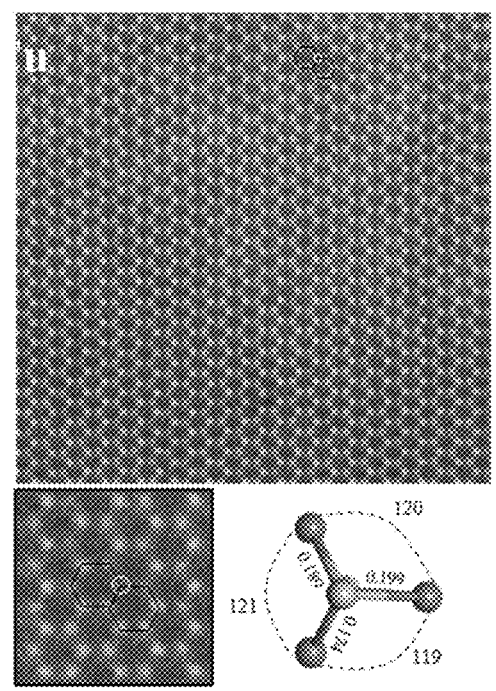

In FIG. 7, the reducing power of different metals, as compared to that of H$_2$, is arranged to form the periodic table of elements, in which Al is a relatively stable active metal at room temperature, with a reduction potential of ~−1.7 V vs. H$_2$; while the activities of Zn, Fe, Ni, Sn, and Pb decrease in turn, with Cu being the least active and is placed after H$_2$.

The atomic structures and elemental compounds of monolayer WSe$_2$ thus synthesized were further investigated by atom-resolved scanning transmission electron microscopy (STEM), as results are shown in photos as provided in FIGS. 8A to 8H. WSe$_2$ grown with assisted metal catalysts showed the same honeycomb hexagonal structure as that produced in the presence of H$_2$, all of which were the trigonal prismatic 2H phase. In addition, these metals were also involved in the growth of the films, as the resulting metal dissolution, selenization or decomposition made the doping of metals inevitable during film deposition. As expected, the presence of foreign atoms was observed in the STEM images of part of the materials, as demonstrated in the atomic-scale high angle annular dark field (HAADF) images.

Figure 9A:
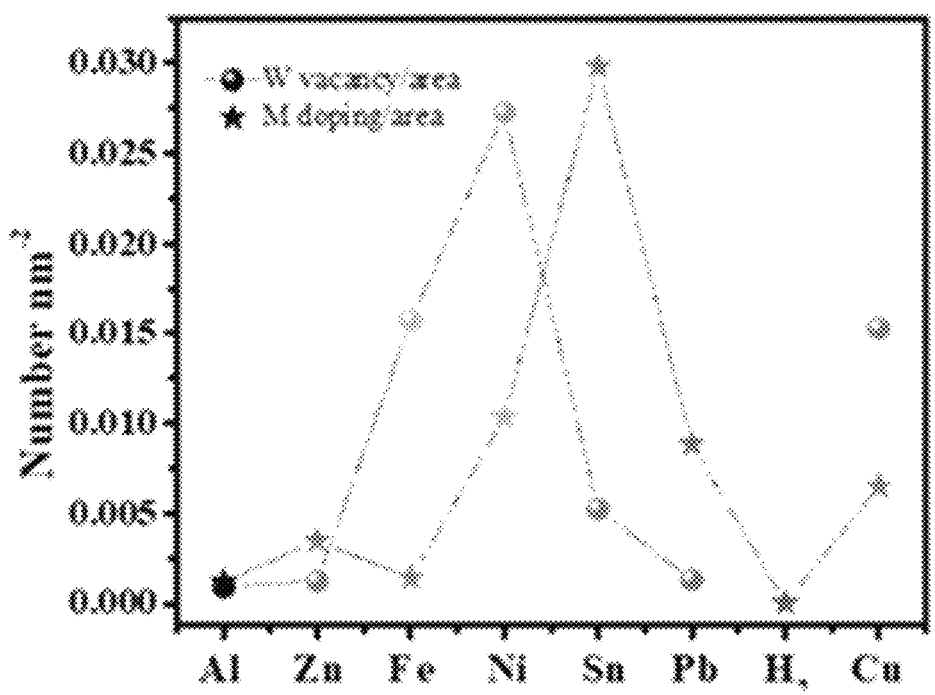
FIG. 9A is a line graph depicting statistics of defects density ($V_W$ and metal doping) of $WSe_2(M)$ grown in the presence of various metals in accordance with one embodiment of the present disclosure.
Figure 9D:
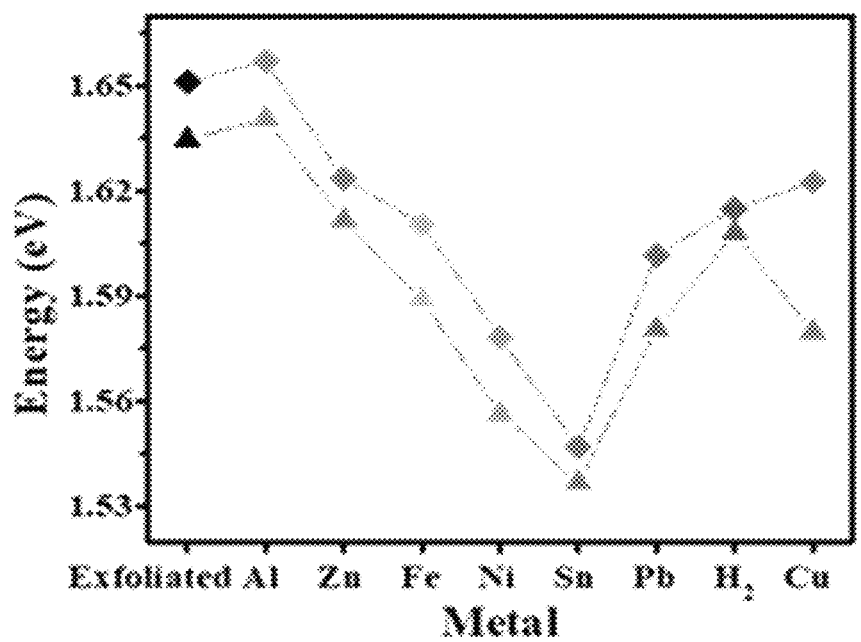
FIG. 9D is a line graph depicting statistic PL intensity of $WSe_2(M)$ from FIG. 9C.
Figure 9B:
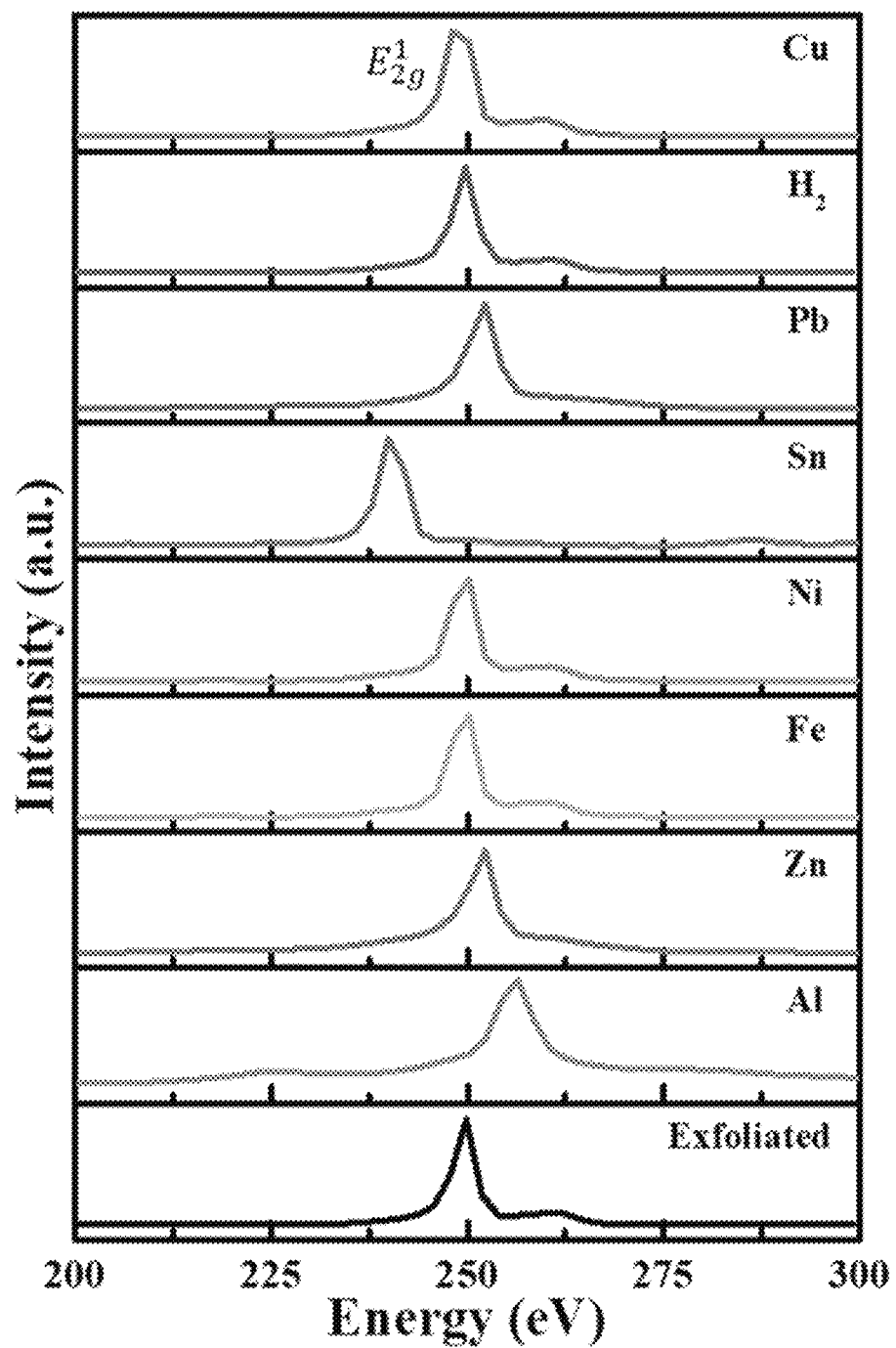
FIGS. 9B and 9C are respectively Raman and PL spectra of $WSe_2(M)$ grown in the presence of various metals in accordance with one embodiment of the present disclosure.
Figure 9C:
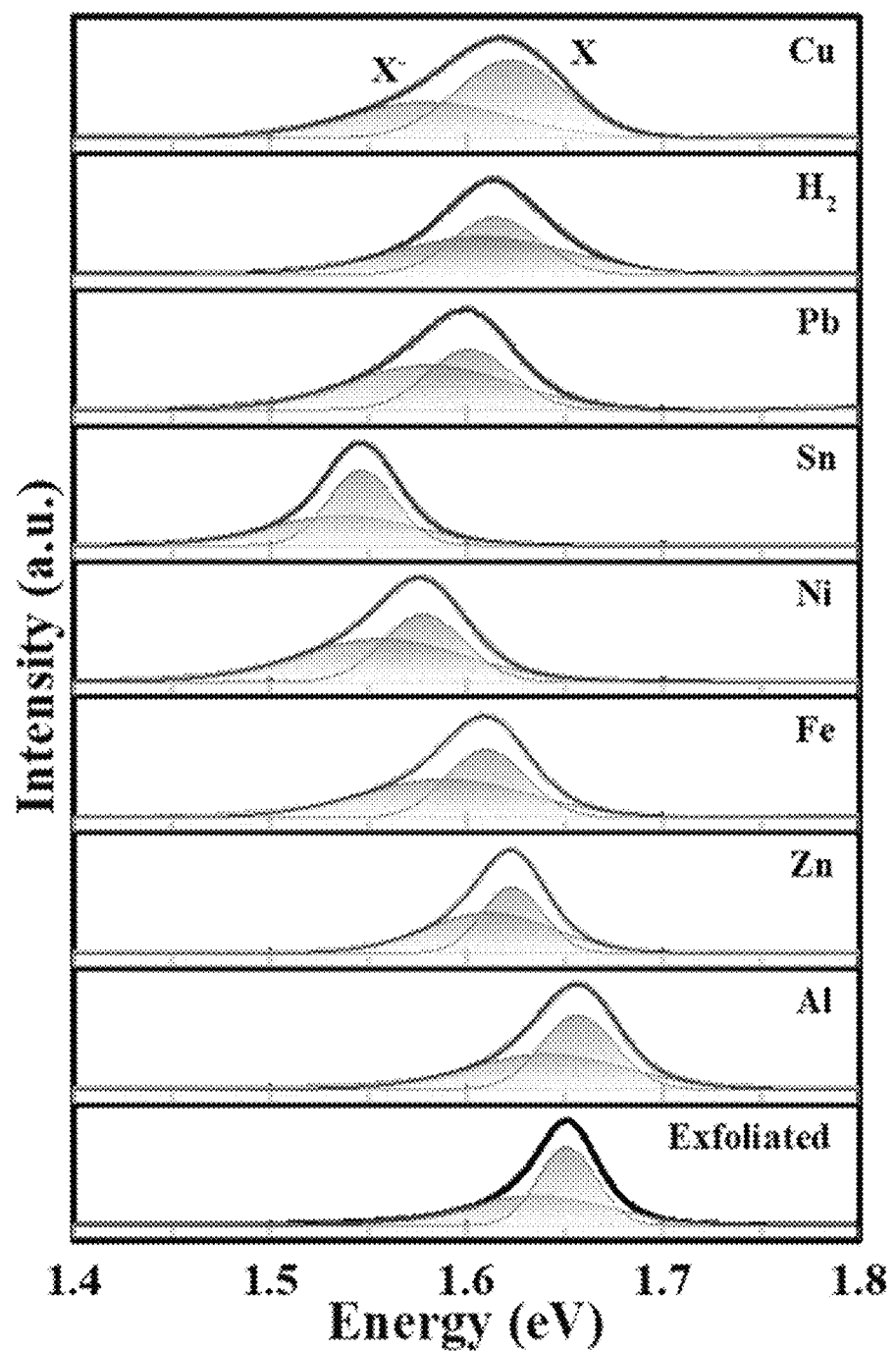

The structural information of the thus produced monolayer WSe$_2$ (M) was further investigated by Raman and photoluminescence (PL) spectroscopies, and results are provided in FIGS. 9A to 9D. Raman spectra of various WSe$_2$ tested under 514 nm excitation displayed one prominent peak of $E_{2g}^1$ near 251 cm$^{-1}$ likes exfoliated sample (FIG. 9B), which is associated with the in-plane displacement of transition metal and chalcogen atoms. The Raman scattering showed slight difference in the position between different metals, especially in WSe$_2$ (Sn) with a biggest Raman shift to ~240.22 cm$^{-1}$, which should be related to more Sn doping in the lattice as depicted in STEM results. PL spectra is more sensitive to defects. As shown in FIG. 9C, the exfoliated WSe$_2$ exhibited a peak near 1.65 eV, and the corresponding spectrum could be fitted to two main peaks of the neutral exciton X (1.634 eV) and the negatively charged exciton X$^-$ (1.651 eV). PL emission of different WSe$_2$ (M) exhibited energy fluctuation, WSe$_2$(Al) was consistent with the exfoliated sample, and WSe$_2$(Sn) exhibited a largest redshift (FIG. 9D), which was closely related to defects in the sample, especially metal doping. Taken together, the metal-assisted deposition strategy can enrich and regulate the regulation of the physical and chemical properties of WSe$_2$.

To investigate the role of metals in the system, the structure of residue metal was characterized by X-ray diffraction (XRD). The diffraction profile of pristine Al showed conspicuous diffraction peaks at 38.4, 44.7, 65.1, and 78.2, ascribes to the crystallized cubic structure (JCPDS #85-1327). New peaks around 28.5° and 30.2° appeared in the residue and which is indexed to (002) and (101) planes of Al$_2$Se$_3$ (FIG. 10A), respectively, meaning part of the Al was selenized. However, this selenization of W did not occur in the absence of reducing atmospheres such as H$_2$. From density functional theory (DFT) in FIG. 10B, Al$_2$Se$_3$ exhibited lower formation energy than WSe$_2$, so the selenization of Al was a priority. In thermogravimetric analysis (TGA), when the reaction residue was heated from 20° C. to 840° C. (the procedure was consistent with the growth process), about 15% of Al$_2$Se$_3$ loaded in the crucible evaporated. This partial evaporation corresponded to the decomposition of Al$_2$Se$_3$, and this reversible but not intense selenization and decomposition provided an adequate environment for WSe$_2$ to grow.

Figure 10A:
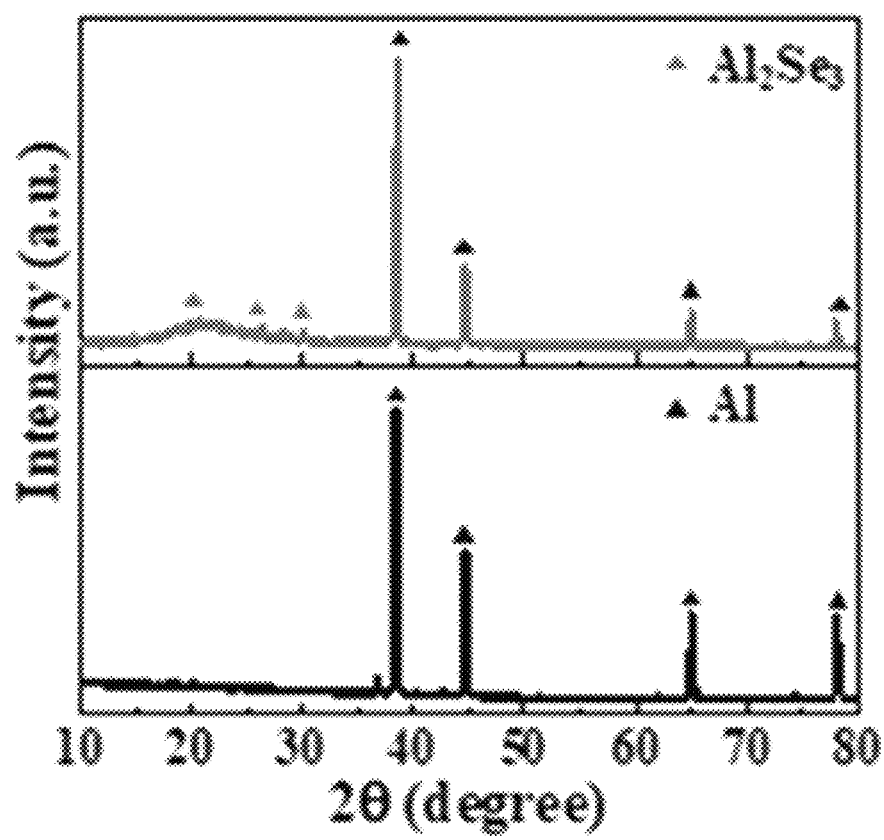
FIG. 10A depicts XRD patterns of pristine Al particles and $Al_2Se_3$ in accordance with one embodiment of the present disclosure.
Figure 10B:
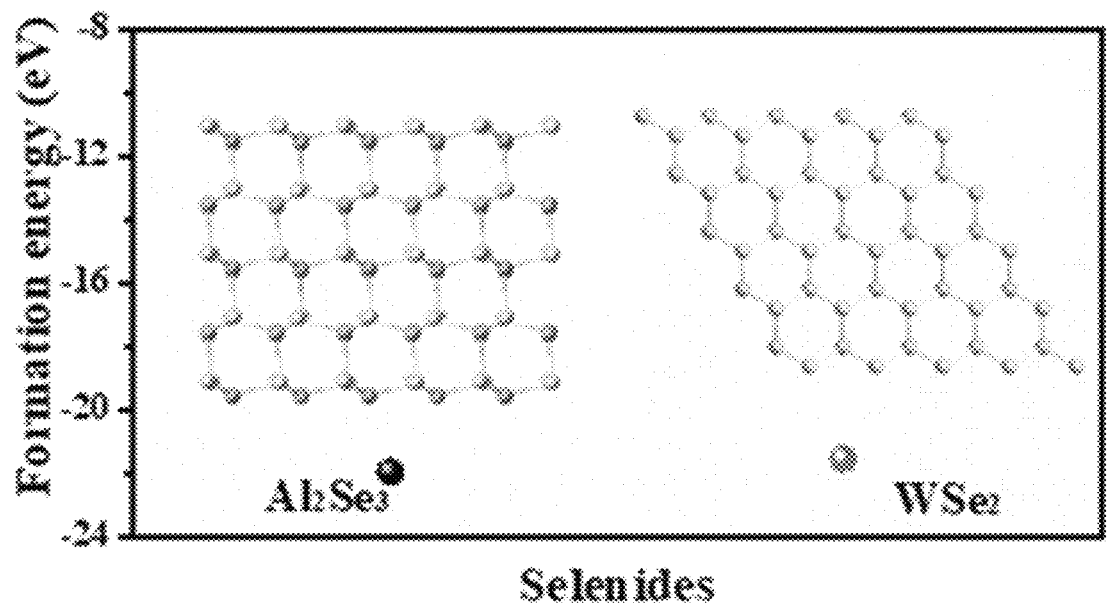
FIG. 10B depicts the calculated formation energy of $Al_2Se_3$ and $WSe_2$ in accordance with one embodiment of the present disclosure.
Figure 10C:
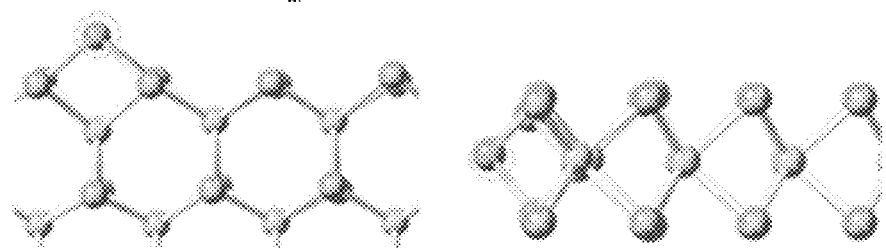
FIG. 10C depicts the absorption configuration of metals on $MoS_2$ surface and edge in accordance with one embodiment of the present disclosure.
Figure 10C:
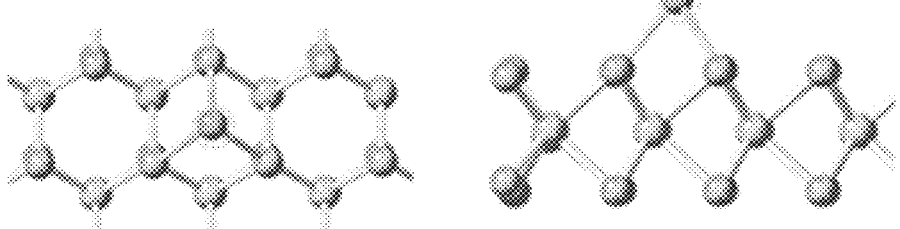
Figure 10D:
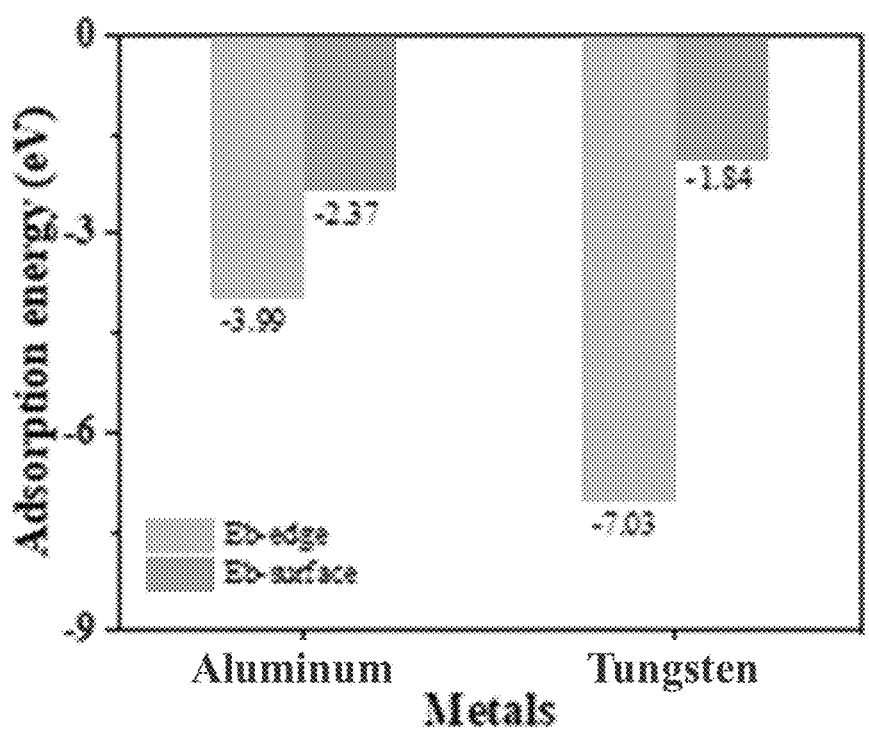
FIG. 10D depicts the adsorption energy of W and Al metal atoms at edge and surface sites on the monolayer $WSe_2$ crystal in accordance with one embodiment of the present disclosure.

Furthermore, the adsorption energy of metal atoms at possible sites on the monolayer WSe$_2$ crystal, including the edge and the surface location, was calculated, and results are depicted in FIG. 10C. According to the calculation results, W tended to adsorb on the edge, while Al tended to adsorb on the surface. The adsorbability of W atoms at the WSe$_2$ edge was nearly four orders of magnitudes stronger than that of Al atoms, which was conducive to the continuous growth of monolayer crystal (FIG. 10D). On the other hand, Al atoms adsorbated on the surface were unstable and easily decomposed during high-temperature synthesis, so the grown WSe$_2$ was basically free of additional element doping, which was consistent with STEM results.

In summary, we innovatively proposed a sacrificing reduced metals approach for the preparation of high quality atomically thin transition metal selenides, overcoming the limitation of long-term dependence on H$_2$ (i.e., H$_2$Se). These metals, including Al, Zn, Fe, Ni, Sn, Pb, and Cu, provide selenizing atmosphere and selectively occupy surface sites, promoting lateral growth of WSe$_2$. In addition, depending on the activity and evaporation degree of different metal and metal tungsten selenide, metal doping could also be achieved. The experimental results showed that Sn was most easily doped into WSe$_2$ lattice, while Al was basically undoped. The present disclosure provides an efficient strategy to produce good-quality 2D TMSs, providing a broad scope for exploring the extraordinary physical characteristics and nanodevice applications It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of the present disclosure.

What is claimed is:

1. A method of producing a substrate having a single-layer transition metal selenide (TMS) nanoflakes deposited thereon in a reaction chamber, in which the reaction chamber has a tubular body, and first and second containers disposed in the tubular body, the method comprises,
   (a) spin-coating the substrate with a transition metal source solution;
   (b) respectively placing a selenium source and a reducing agent in the first and second containers, in which the reducing agent is a metal and not hydrogen gas;
   (c) placing the substrate of step (a) above the second container with the spin-coated side of the substrate facing the reducing agent housed therein;
   (d) purging the reaction chamber with an inert gas, in which the inert gas flows from the first container towards the second container;
   (e) subjecting the reaction chamber in a heating program, in which the temperature in the first container is raised from room temperature to 400° C. in 20 minutes and kept for 15 minutes, while the temperature in the second container is raised from room temperature to 750-900° C. in 25 minutes and kept for 5-15 minutes;
   (f) allowing the temperature of the second container to cool down to 500° C.; and
   (g) cooling the reaction chamber to room temperature thereby depositing the single-layer TMS nanoflakes on the substrate.

2. The method of claim 1, wherein in step (a), the transition metal source solution is produced by dissolving a salt of a transition metal in water.

3. The method of claim 2, wherein the transition metal is selected from the group consisting of indium (In), molybdenum (Mo), rhenium (Re), and tungsten (W).

4. The method of claim 3, the transition metal source solution further comprises iodixanol or glycerol.

5. The method of claim 3, wherein in step (a), the substrate is spin-coated with the transition metal source solution at 800 rpm for 5 seconds, followed by 3,000 rpm for 60 seconds.

6. The method of claim 5, wherein in step (b), the selenium source in the first container is selenium beads; and the metal in the second container is selected from the group consisting of alumina, copper, iron, nickel, lead, tin, and zinc.

7. The method of claim 6, wherein the metal is zinc.

8. The method of claim 6, wherein the selenium source and the metal are present in a ratio of 10:1 by weight in the reaction chamber.

9. The method of claim 1, wherein the substrate is made of $SiO_2$, mica or sapphire.

10. The method of claim 1, wherein the inert gas is helium, nitrogen or argon.

11. The method of claim 10, wherein the reaction chamber is purged with argon at a flow rate of 100-300 mL/minute.

12. The method of claim 11, wherein in step (e), the temperature in the second container is raised from room temperature to 800° C. in 25 minutes and kept for 15 minutes.

13. The method of claim 1, further comprising cleansing the substrate with an acidic solution prior to step (a).

14. The method of claim 13, wherein the acidic solution is a solution of sulfuric acid.

15. The method of claim 1, wherein the single-layer TMS nanoflakes is any one of $In_2Se_3$, $MoSe_2$, $ReSe_2$, or $WSe_2$ nanoflakes.

* * * * *